(12) United States Patent
Samra et al.

(10) Patent No.: US 10,951,201 B2
(45) Date of Patent: Mar. 16, 2021

(54) FLIP FLOP STANDARD CELL

(71) Applicant: Taiwan Semiconductor Manufacturing Company, Ltd., Hsinchu (TW)

(72) Inventors: Nick Samra, Austin, TX (US); Stefan Rusu, Sunnyvale, CA (US); Ta-Pen Guo, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/428,123

(22) Filed: May 31, 2019

(65) Prior Publication Data

US 2020/0059223 A1 Feb. 20, 2020

Related U.S. Application Data

(60) Provisional application No. 62/764,735, filed on Aug. 15, 2018.

(51) Int. Cl.
| | | |
|---|---|---|
| *H03K 3/037* | (2006.01) | |
| *G01R 31/317* | (2006.01) | |
| *G11C 11/412* | (2006.01) | |
| *G01R 31/3177* | (2006.01) | |
| *G11C 11/419* | (2006.01) | |
| *G11C 11/418* | (2006.01) | |

(52) U.S. Cl.
CPC ....... *H03K 3/0372* (2013.01); *G01R 31/3177* (2013.01); *G01R 31/31713* (2013.01); *G11C 11/412* (2013.01); *G11C 11/419* (2013.01); *G11C 11/418* (2013.01)

(58) Field of Classification Search
CPC .......... G01R 31/3177; G01R 31/31713; G01R 31/31723; G01R 31/31725; G01R 31/318572; G01R 31/318525; G11C 11/412; G11C 11/419; H03K 3/037; H03K 3/0372; H03K 3/073
See application file for complete search history.

(56) References Cited

U.S. PATENT DOCUMENTS

| | | | |
|---|---|---|---|
| 8,542,522 B2 | 9/2013 | Snider | |
| 9,384,812 B2 | 7/2016 | Wu et al. | |
| 10,699,054 B2 * | 6/2020 | Lee | ..................... G06F 30/3312 |
| 2008/0258789 A1 | 10/2008 | Motomura | |
| 2010/0321063 A1 * | 12/2010 | Ferchland | .............. H03K 19/21 |
| | | | 326/52 |
| 2015/0318845 A1 * | 11/2015 | Pasternak | .......... H03K 3/35625 |
| | | | 327/203 |
| 2019/0057179 A1 | 2/2019 | Lee | |
| 2019/0325107 A1 * | 10/2019 | Kim | ..................... H01L 23/528 |

FOREIGN PATENT DOCUMENTS

KR    10-2008-0053185 A    6/2008

* cited by examiner

*Primary Examiner* — Shelly A Chase
(74) *Attorney, Agent, or Firm* — Merchant & Gould P.C.

(57) ABSTRACT

A flip flop standard cell that includes a data input terminal configured to receive a data signal, clock input terminal configured to receive a clock signal, a data output terminal, and a latch. A bit write circuit is configured to receive a bit write signal. The received data signal is latched and provided at the output terminal in response to the bit write signal and the clock signal. A hold circuit is configured to receive a hold signal, and the received data signal is not latched and provided at the data output terminal in response to the hold signal and the clock signal.

20 Claims, 9 Drawing Sheets

FLIP FLOP STANDARD CELL

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

EDA can be divided into a series of stages such as synthesis, placement, routing, etc. Each of these steps can involve selecting cells from a library of cells. Typically, a very large number of different circuit designs using various cell combinations can meet a functional specification for a circuit. For example, flip flops are fundamental building blocks of digital circuits and thus are often included in standard cell libraries. A flip flop is a circuit that has two stable states and can be used to store state information. Flip flops have one or two outputs and can be made to change state by signals applied to one or more control inputs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
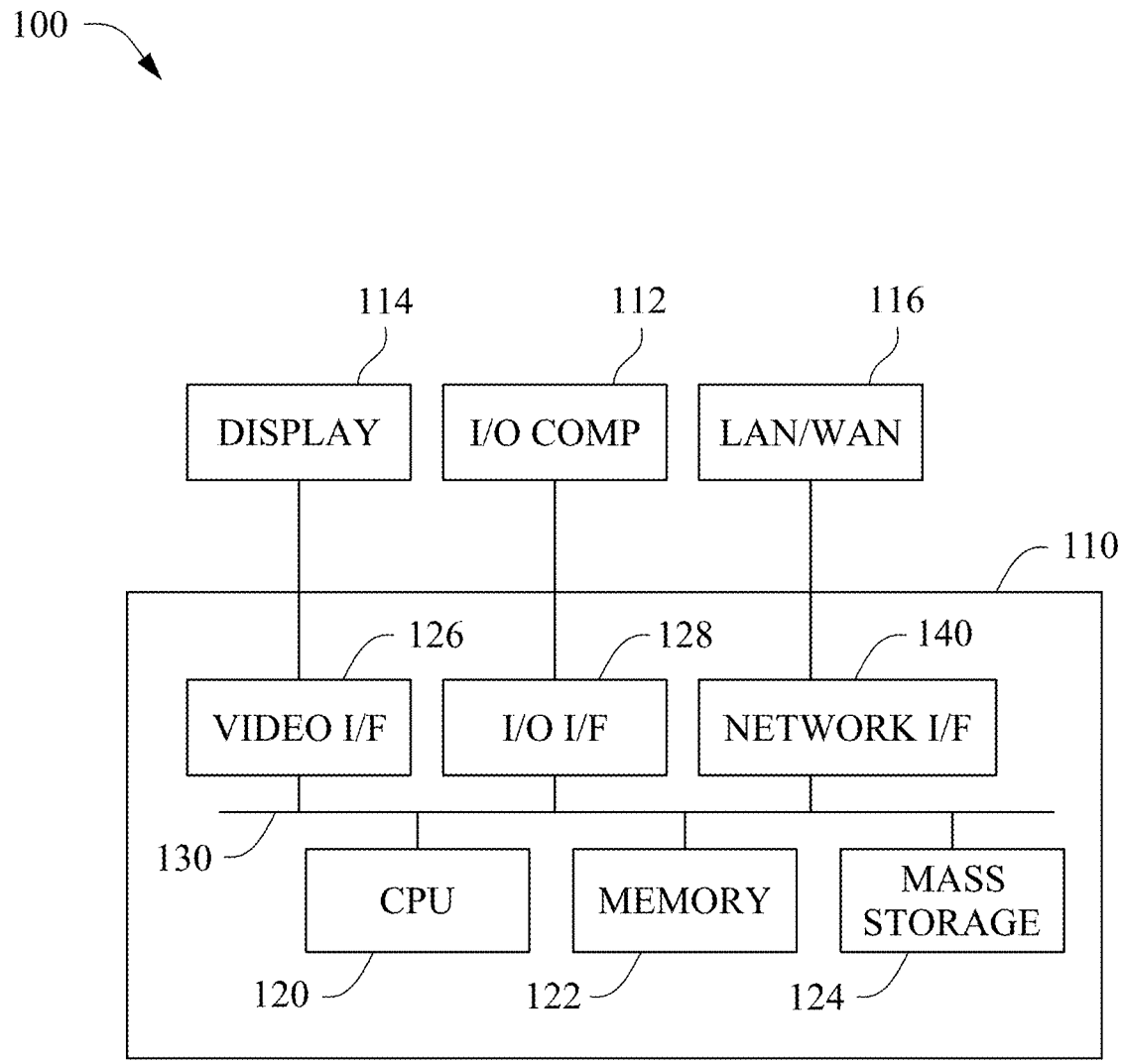
FIG. 1 is a block diagram illustrating an example of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic Design Automation (EDA) tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. Once mapped, a synthesis is performed to turn the structural design into a physical layout, a clock tree is built to synchronize the structural elements, and the design is optimized post layout.

FIG. 1 is a block diagram illustrating an example of a processing system 100 in accordance with some embodiments disclosed herein. The processing system 100 may be used to implement an EDA system in accordance with various processes discussed herein. The processing system 100 includes a processing unit 110, such as a desktop computer, a workstation, a laptop computer, a dedicated unit customized for a particular application, a smart phone or tablet, etc. The processing system 100 may be equipped with a display 114 and one or more input/output devices 112, such as a mouse, a keyboard, touchscreen, printer, etc. The processing unit 110 also includes a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. The memory 122 and mass storage device 124 are computer storage media examples (e.g., memory storage). The mass storage device may further store a library of standard cells, as will be discussed further herein below.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the processing device 100. Any such computer storage media may be part of the processing device 100. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The video adapter 126 and the I/O interface 128 provide interfaces to couple external input and output devices to the processing unit 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

Embodiments of the processing system 100 may include other components. For example, the processing system 100 may include power supplies, cables, a motherboard, removable storage media, cases, and the like. These other components, although not shown, are considered part of the processing system 100.

In some examples, software code is executed by the CPU 120 to analyze a user design to create a physical integrated circuit layout. The software code may be accessed by the CPU 120 via the bus 130 from the memory 122, mass storage device 124, or the like, or remotely through the network interface 140. Further, in some examples, the physical integrated circuit layout is created based on a functional integrated circuit design, which may be received though the I/O interface 128 and/or stored in the memory 122 or 124 in accordance with various methods and processes implemented by the software code.

A standard cell can include an entire device, such as a transistor, diode, capacitor, resistor, or inductor, or can include a group of several devices arranged to achieve some particular function, such as an inverter, a flip flop, a memory cell, or an amplifier, among others. In addition to making functional design easier to conceptualize, the use of standard cells can reduce verification time for design rule checking (DRC) of the layout features within the IC, because a standard cell that is repeated throughout the layout can be checked a single time in DRC rather than each instantiation being checked individually. Based on the received functional circuit description, the system 100 is configured to select standard cells from the cell library. As noted above, flip flops may be included in a standard cell library. A flip flop is a circuit that has two stable states and thereby is capable of serving as one bit of memory. A flip flop is usually controlled by one or two control signals and a clock signal.

Memory for IC devices may be constructed using several different methods. For example, a full custom static random access memory (SRAM) or register file array may be designed and instantiated in a design as a black box. This full custom block can have any functionality desired (such as bit write capability), but the necessary design work can be complicated and time consuming. In addition, a section of the design must be blocked off to insert the "black box" array. This blocked off section restricts routing on certain layers and often requires a "keep-out" region that blocks the placement of normal standard cells near it. Thus, such black-box designs can make inefficient use of available area.

For small arrays, a memory array may be synthesized flip flop standard cells. Flip flops are typically larger than SRAM bit cells, but the overall array may be smaller since the overhead associated with a custom SRAM array is not required. In addition, the design effort needed for a synthesized array is less. A compromise between the full custom, black-box arrays and simple synthesis with flops is building an array of using flip flop standard cells. This array uses the same standard cell flops as the synthesis approach, but the cells are carefully placed in an array-like fashion. This allows for higher cell utilization than synthesis, while still using standard cells that do not require overhead such as keep-out regions. For example, typical synthesis usually has utilizations in the range of 70-80%, but by hand placing the flops in a standard cell array, that utilization can be improved to 90-95%. However, the actual cells used are still restricted to what is available in the standard cell library, which still limits the area density.

Figure 2A:
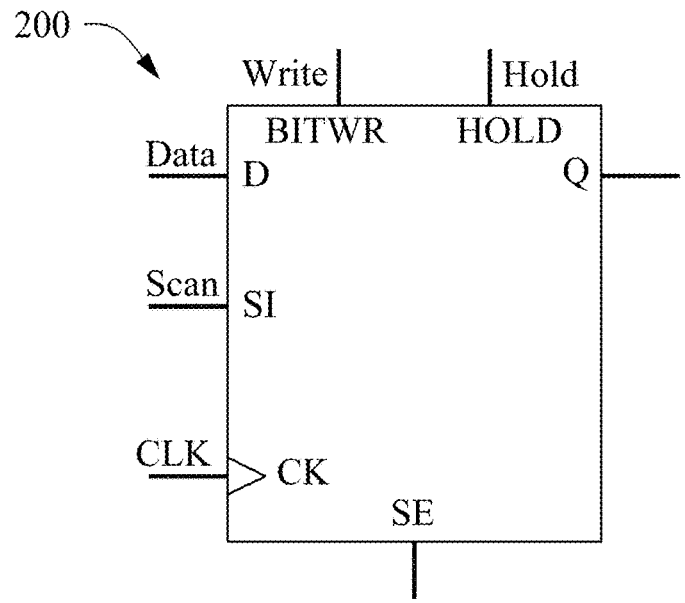
FIGS. 2A and 2B are block diagrams illustrating aspects of an example flip flop standard cell in accordance with some embodiments.

FIG. 2A illustrates a flip flop standard cell 200 in accordance with aspects of the present disclosure. The flip flop standard cell 200 has a data input terminal D configured to receive a data signal, clock input terminal configured to receive a clock signal, and an output terminal Q providing a data output signal. As will be discussed further below, the flip flop standard cell 200 includes a latch that receives, for example, the signal received at the input terminal D and outputs the latched signal to the Q output terminal.

Since the illustrated flip flop standard cell 200 is configured for forming bit cells in a memory array, the flip flop standard cell 200 further includes a bit write terminal BITWR configured to receive a write signal, which indicates that the received data signal is to be latched and provided at the output terminal Q in response to the clock signal CLK. Additionally, a hold terminal HOLD is configured to receive a hold signal, which indicates a first, or current data value at the data output Q is continued to be latched and thus held, rather than latching and outputting the received data signal to the output Q, even when the clock signal pulses.

Typical flip flop standard cells do not include bit write or hold functionality native thereto. Instead, additional circuitry external to the flip flop standard cell is required to perform these functions when an array is constructed with typical flip flop standard cells. The additional circuits required for this functionality can take up substantial floor plan space. Consistent with the present disclosure, the illustrated flip flop standard cell 200 is configured for constructing a memory array. Integrating functions such as bit write and hold with the flip flop standard cell 200 itself reduces power usage and saves space.

In some embodiments, the flip flop standard cell 200 is a scan flip flop. A scan flip flop facilitates testing processes for interconnected flip flops, for example, to determine if an error is propagated along the chain of flip flops during a scan shifting mode of operation. An output of the scan flip flop is therefore coupled with an input of an adjacent scan flip flop in the chain. The flip flop standard cell 200 thus includes a scan input terminal SI and a scan enable terminal SE. Based on the received scan enable signal, either the data input terminal D or the scan input terminal SI is connected to the latch of the flip flop standard cell 200 and provided at the output terminal Q.

Figure 2B:
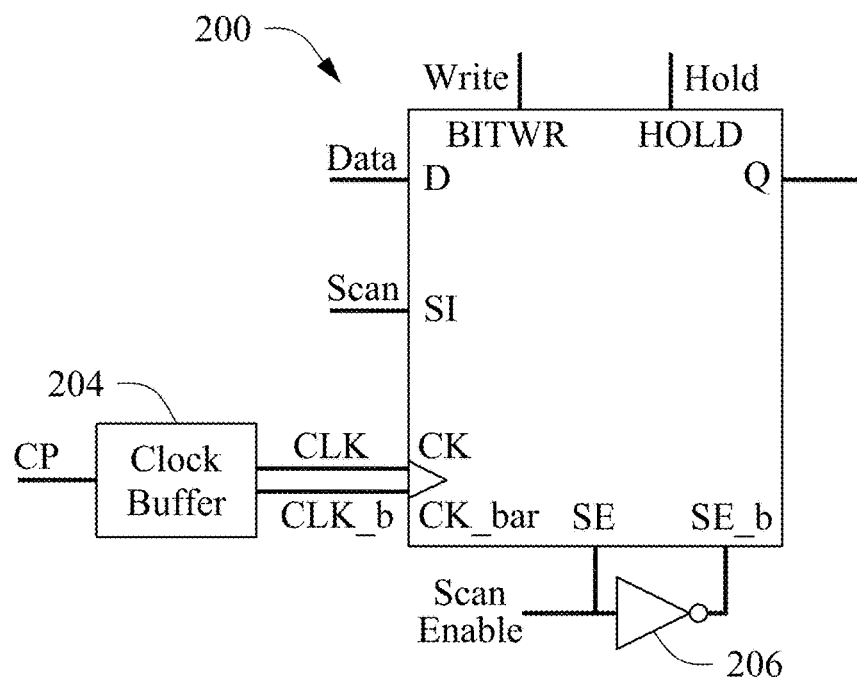

As noted above, the flip flop standard cell 200 is configured for use in a memory array. Thus, certain functions and signals are not required to be received or generated by every flip flop standard cell 200 of the array. FIG. 2B illustrates further aspects of the flip flop standard cell 200. Typically, a flip flop receives a clock pulse and generates an inverted clock signal with a buffer circuit local to the flip flop standard cell. In the example shown in FIG. 2B, a clock buffer 204 external to the flip flop standard cell 200 receives a clock pulse, and outputs the clock signal CLK and also the inverted clock signal CLK_b. The illustrated flip flop standard cell 200 thus receives the clock signal CLK and the clock bar signal CLK_b generated external to the flip flop standard cell 200. Since the flip flop standard cells 200 forming a memory array typically operate on a common clock signal, it is not necessary for each flip flop standard cell 200 of the array to include a clock buffer to generate the CLK_b signal.

Similarly, the scan function is used for testing a chain of flip flops. Thus, each of the flip flops in the chain typically receives a common scan enable signal. It is therefore not necessary for each flip flop cell to include circuitry to generate the logically inverted scan enable signal SE_b. Instead, the scan enable signal SE is received by an inverter 206 external to the flip flop standard cell 200 that outputs the SE_b signal, further saving space and power on the flip flop standard cell 200.

Figure 3:
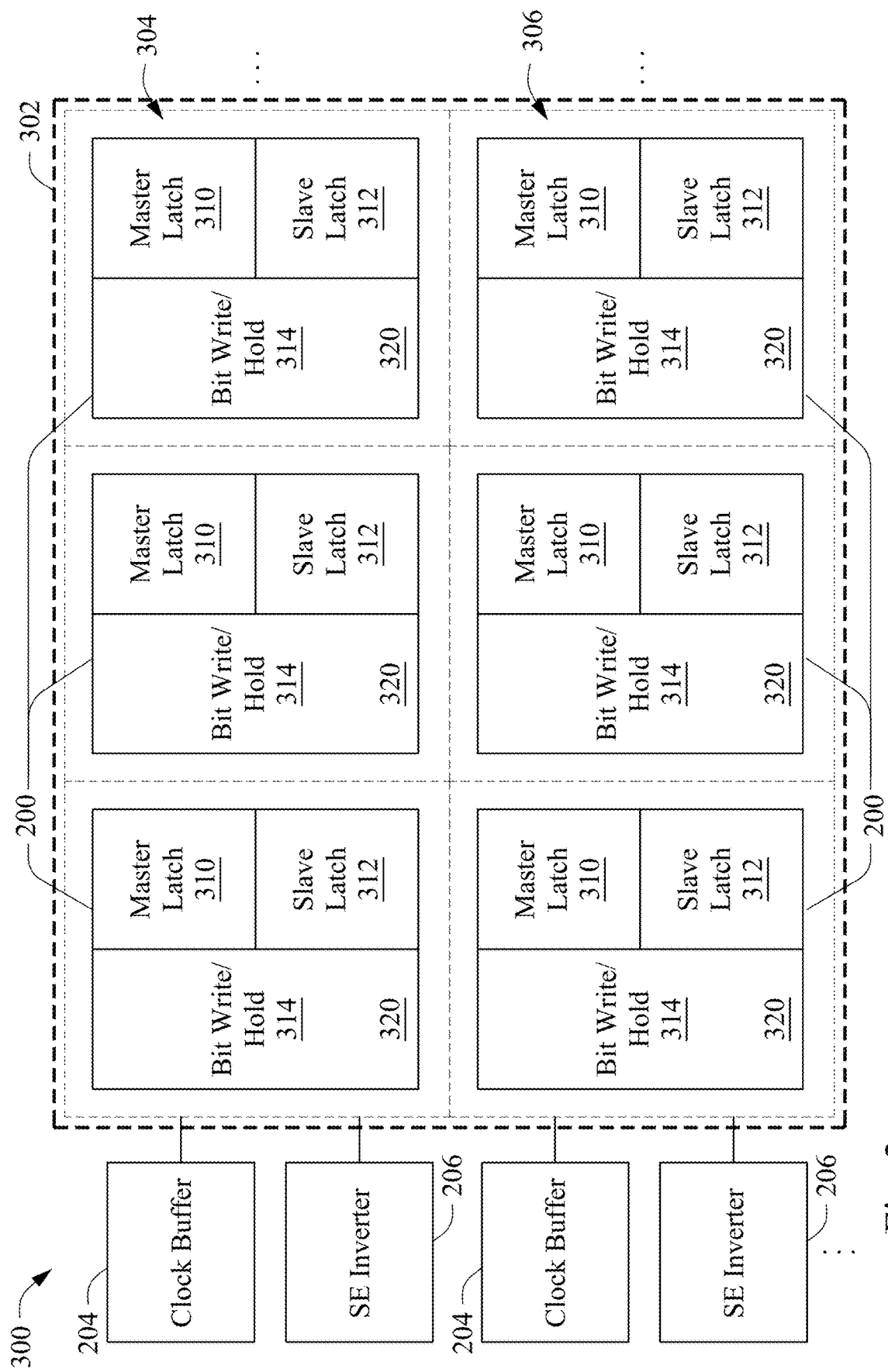
FIG. 3 is a block diagrams depicting an array of flip flop standard cells in accordance with some embodiments.

FIG. 3 is a block diagram illustrating aspects of an example memory device 300 that includes a bit cell array 302 made up of a plurality of the flip flop standard cells 200. As noted above, each of the flip flop standard cells 200 has a master latch 310 and a slave latch 312, and an input section 320 that includes bit write and hold circuits 314. In the example array 302, the flip flop standard cells 200 are arranged in columns and rows. The array 302 can be sized based on the desired memory capacity. FIG. 3 illustrates a 2×3 array for ease of discussion, though other array sizes may be utilized depending on the required conditions for the desired memory capacity and are within the scope of this disclosure. A clock buffer 204 and SE inverter 206 each provide outputs to a plurality of the flip flop standard cells 200. In some examples, the clock buffer 204 may provide the clock signal CLK and the inverted clock bar signal CLK_b to the connected flip flop standard cells 200 based on a received clock pulse. The SE inverter 206 provides the inverted scan enable signal SE_b to each of the connected flip flop standard cells 200. In the example shown in FIG. 3, the illustrated first and second rows 304, 306 of the array 302 each have a respective clock buffer 204 and SE inverter 206 providing signals to each of the flip flop standard cells 200 in the respective rows 304, 306. In this manner, the flip flop standard cells 200 in each row 302, 304 are configured to share the clock and SE_b signals with the plurality of other flip flop standard cells 200 in their row of the array 302. Since the clock buffers 204 and SE inverters 206 are shared among a plurality of the flip flop standard cells 200, a denser array packing may be achieved, while reducing the array power requirements.

Consistent with aspects of the disclosure, the memory device 300 achieves further efficiencies by sharing of transistors of the various circuit elements of the memory array 302. For instance, redundant transistors and their functions are moved from the individual flip flop standard cells 200 to the array level of the device 300 and shared among the plurality of flip flop standard cells 200.

Figure 4:
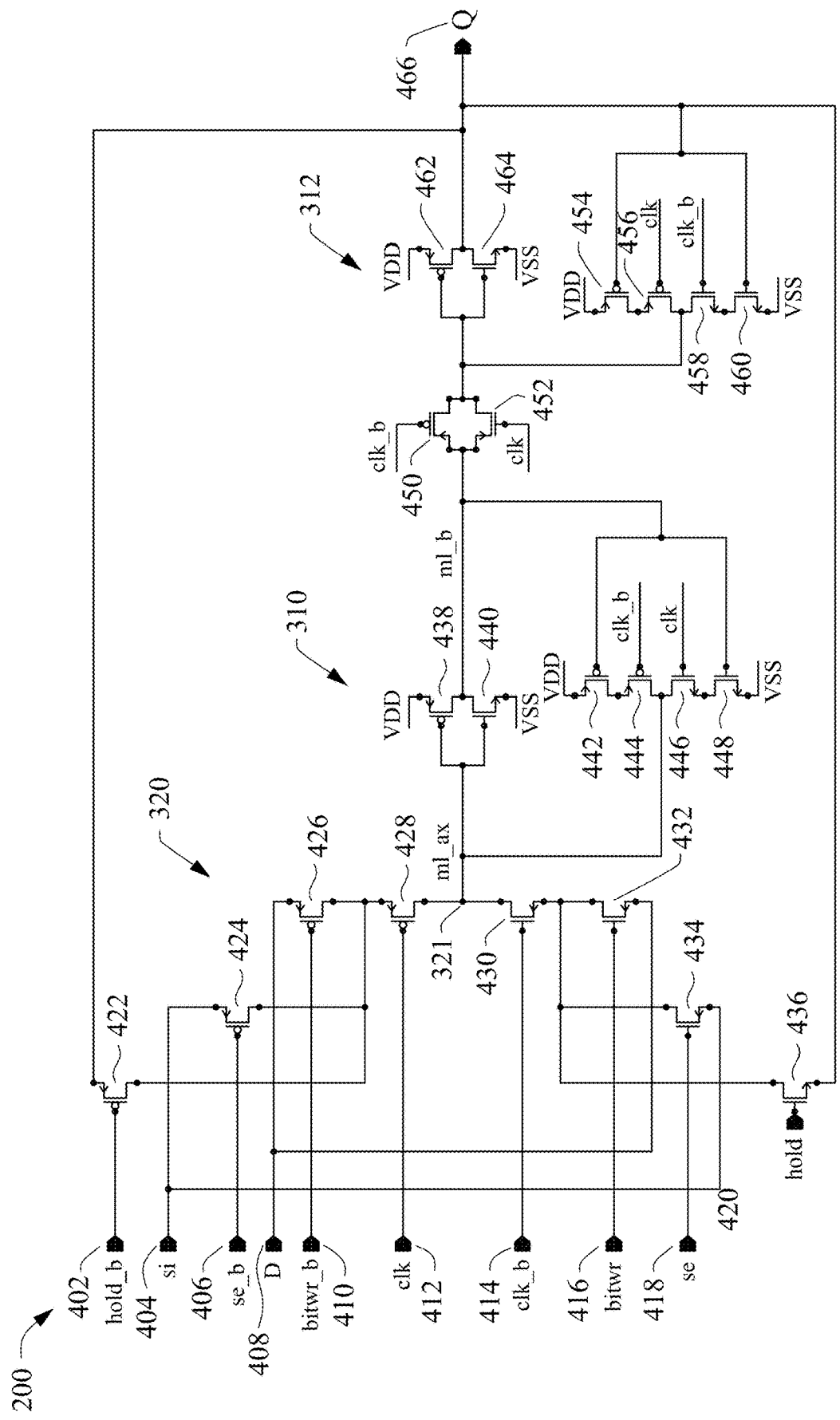
FIG. 4 is a circuit diagram illustrating a flip flop standard cell in accordance with some embodiments.

Referring now to FIG. 4, a circuit diagram of an example of the flip flop standard cell 200 is illustrated. The flip flop standard cell 200 has a plurality of input terminals including a hold bar terminal 402 configured to receive a hold bar signal HOLD_b (logically inverted hold signal HOLD), a scan input terminal 404 configured to receive a scan data signal SI, a scan enable bar terminal 406 configured to receive a scan enable bar signal SE_b (logically inverted scan enable signal SE), a data input terminal 408 configured to receive a data input signal D, a bit write bar terminal 410 configured to receive a bit write bar signal BITWR_b (logically inverted bit write signal BITWR), a clock terminal 412 configured to receive a clock signal CLK, a clock bar terminal 414 configured to receive a clock bar signal CLK_b (logically inverted clock signal CLK), a bit write terminal 416 configured to receive the bit write signal BITWR, a scan enable terminal 418 configured to receive the scan enable signal SE, and a hold terminal 420 configured to receive the hold signal HOLD. A data output terminal 466 is configured to output the data signal Q.

The flip flop standard cell 200 includes a master latch 310 and a slave latch 312, and an input stage 320 that includes the bit write and hold circuits 314. The master latch 310 is coupled to an output node 321 of the input stage 320 and the slave latch 312 is coupled to the output of the master latch 310. As noted above, the flip flop standard cell 200 does not include an on-board clock buffer, but instead receives the clock signal CLK and the logically inverted clock bar signal CLK_b at the terminals 412, 414. The clock signals CLK, CLK_b control transmission gates within the master and slave latches 310, 312 and the input stage 320. The input terminals 412, 414 receiving the clock and clock bar signals CLK, CLK_b are respectively connected to gate terminals of a PMOS clock transistor 428 and an NMOS clock transistor 430. The junction of the clock transistors 428 and 430 form the output node 321, which is the input to the master latch 310. The input terminals of the clock transistors 428, 430 receive the output of the hold transistors 422, 436 and the scan enable transistors 424, 434 such that the scan input terminal 404 or the data output terminal 466 is coupled to the output node 321 of the input stage 320 in response to the clock signals CLK, CLK_b.

The flip flop standard cell 200 receives the scan enable signal SE at the input terminal 418 to selectively select the scan function to test the flip flop standard cells 200 in an array. However, as noted above, the flip flop standard cell 200 does not include an on-board inverter for providing the logically inverted scan enable bar signal SE_b. Instead, the inverted scan enable bar signal SE_b is generated external to the flip flop standard cell 200 and received at the input terminal 406, reducing the number of transistors required for the flip flop standard cell 200 itself.

The scan input terminal 404 is coupled to input terminals of the scan enable transistors 424, 434, such that the scan enable signals SE, SE_b received at the input terminals 406, 418 control the scan transistors 424, 434, respectively to selectively activate the scan test mode of the flip flop standard cell 200. In the scan mode, the scan input signal SI is provided to the clock transistors 428, 430 in response to the scan enable signals SE, SE_b. In this manner, the scan input signal is selectively provided to the master latch 310 based on the scan enable signals SE, SE_b and the clock signals CLK, CLK_b.

The input stage 320 includes a bit write circuit having a pair of bit write transistors 426, 432, and a hold circuit having a pair of hold transistors 422, 436. The bit write and hold circuits are configured to control the writing of data and the holding of data on the flip flop standard cell 200. The PMOS hold transistor 422 is controlled by the hold bar signal HOLD_b received at the input terminal 402 connected to the gate of the PMOS hold transistor 422, and the NMOS hold transistor 436 is controlled by the hold signal HOLD received at the input terminal 420 connected to the gate of the NMOS hold transistor 436.

The output signal Q is connected to input terminals of the hold transistors 422, 436, and the output terminals of the hold transistors 422, 436 are connected to the output node 321 via the clock transistors 428, 430, such that the flip flop standard cell 200 output Q is fed back from the data output terminal 466 to the master latch 310 based on the hold and clock input signals. More specifically, when the hold signal HOLD is high and the inverted hold bar signal HOLD_b is low, the output signal Q is fed back to the input stage 320 when the clock pulses, such that a first data signal is held on the flip flop standard cell 200. Accordingly, a second data input signal D received at the input terminal 408 is not written (latched) to the flip flop standard cell 200, even when the clock signal pulses if the hold signal HOLD is high and the inverted hold bar signal HOLD_b is low.

The bit write bar BITWR_b and bit write BITWR signals received at the respective input terminals 410 and 416 control the operation of the PMOS bit write transistor 426 and the NMOS bit write transistor 432, respectively. The data input terminal 408 is coupled to the input terminals of the bit write transistors 426 and 432, such that the data signal D received by the terminal 408 is selectively received by the input stage 320 based on the bit write and bit write bar BITWR, BITWR_b signals. For instance, a high bit write signal BITWR (and inverted low bit write bar signal BITWR_b) allows the data signal D received at the input terminal 408 to be written to the flip flop standard cell 200 based on the clock signals CLK, CLK_b.

The output node 321 is coupled to the master latch 310, which includes a first inverter comprised of PMOS and NMOS transistors 438, 440 and a first tri-state inverter that includes PMOS and NMOS transistors 442, 440 and control PMOS and NMOS transistors 444, 446. When the clock signal CLK is high (clock bar signal CLK_b is low) the input of the tri-state inverter is inverted and output to latch the received signal. When the clock signal CLK is low (clock bar signal CLK_b is high) the tri-state inverter is in a high impedance state, and is essentially disconnected from the circuit.

A transmission gate comprised of a PMOS transistor 450 and an NMOS transistor 452 is connected between the master latch 310 and the slave latch 312. The PMOS transistor 450 and the NMOS transistor 452 of the transmission gate respectively receive the clock bar CLK_b and clock CLK signals. Thus, when the clock signal CLK is high (clock bar signal CLK_b is low) the transmission gate transistors 450, 452 are active and the output signal from the master latch 310 is transmitted to the slave latch 312.

The slave latch 312 includes a second inverter comprised of PMOS and NMOS transistors 462, 464 and a second tri-state inverter that includes PMOS and NMOS transistors 454, 460 and control PMOS and NMOS transistors 456, 458, such that the signal received from the master latch 310 is latched and output by the slave latch 312 in response to the clock signal. The output signal Q of the slave latch 312 is provided at the output terminal 466.

Figure 5:
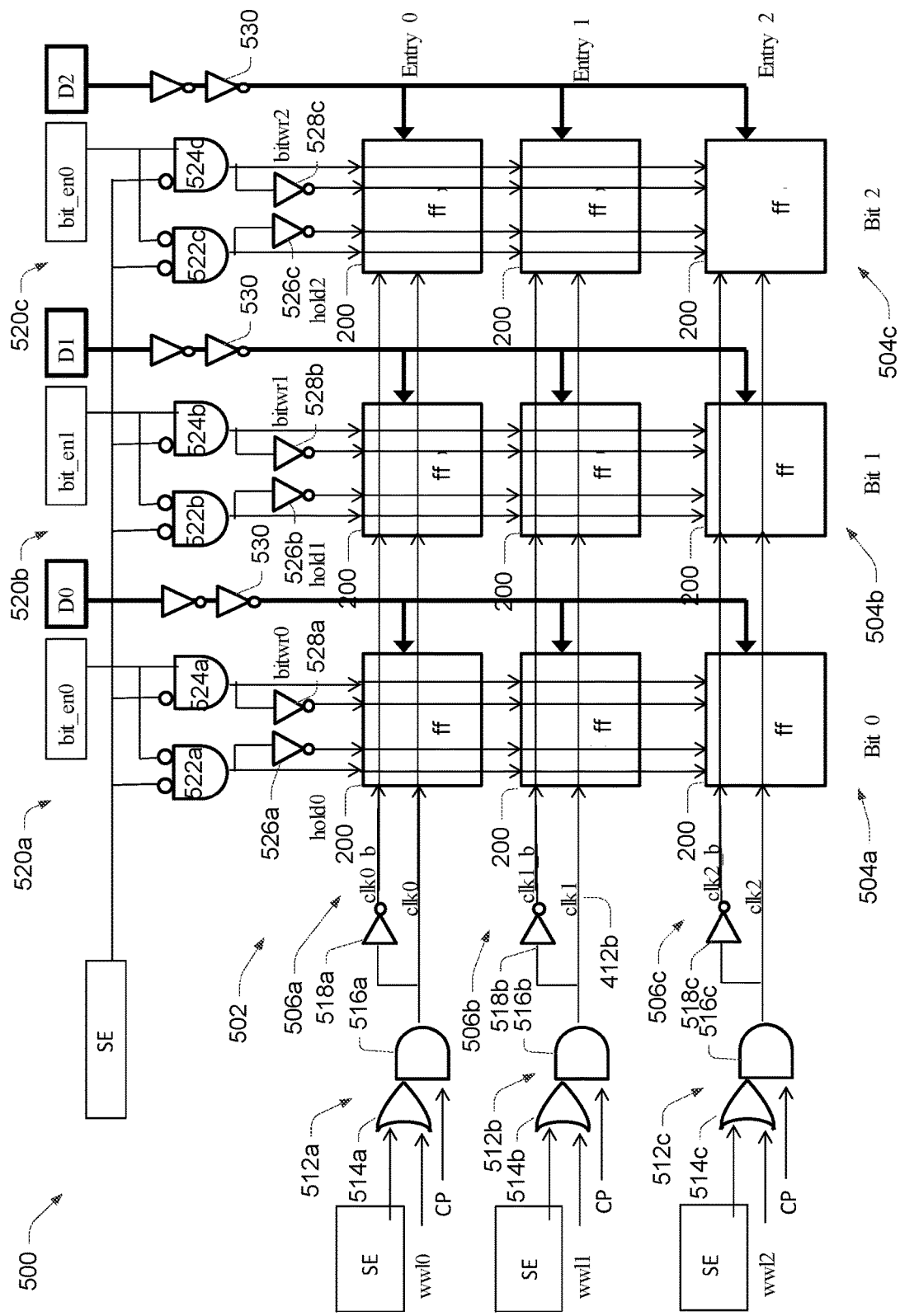
FIG. 5 is a circuit diagram illustrating an example of a memory device including an array of the flip flop standard cells shown in FIG. 4 in accordance with some embodiments.

FIG. 5 illustrates an example memory device 500 with an array 502 of the flip flop standard cells 200. The illustrated example has flip flop standard cells 200 arranged in a 3×3 array, but other array sizes are within the scope of the disclosure. Accordingly, the memory device 500 includes three columns 504a, 504b, 504c for storing three bits of data Bit0, Bit1, Bit2, as well as three rows 506a, 506b, 506c. Since disclosed examples of the flip flop standard cell 200 are configured for use in a memory array, certain components of a typical flip flop are not included with the flip flop cell. Certain logic components that generate the signals for controlling the flip flop standard cells 200 of the array 500 such as the clock buffer and scan enable inverter are provided outside the flip flop standard cells 200.

A plurality of row drivers 512a, 512b, 512c (collectively row drivers 512) are connected to each flip flop standard cell 200 of the respective row 506a, 506b, 506c of flip flop standard cells 200. The row drivers 512 each include a respective OR gate 514a, 514b, 514c (collectively OR gates 514) that receive respective write word line signals ww10, ww11, ww12 (collectively write word line signals wwl) corresponding to the rows 506a, 506b, 506c of the array 502, as well as the scan enable signal SE. The row drivers 512 each further include a respective AND gate 516a, 516b, 516c (collectively AND gates 516) that receive the respective outputs of OR gates 514a, 514b, 514c and a clock pulse CP. Thus, when the scan mode is selected, the scan enable signal SE goes high, resulting in the output of the AND gates 516 alternating with the received clock pulse CP to provide the clock signals CLK0, CLK1, CLK2 for the respective rows 506a, 506b, 506c of the array 502. Each row driver 512 also includes a respective inverter 518a, 518b, 518c (collectively inverters 518) that invert the CLK signal output by the AND gates 516 to provide the clock bar signals CLK0_b, CLK1_b, CLK2_b to each of the flip flop standard cells 200 of the array 502 from a source external to the array 502.

When the memory device 500 is operated in a normal mode (i.e. not the scan mode), the scan enable signal SE is low. In a write operation, the desired row 512 is selected by asserting the appropriate write word line signal ww10, ww11, or ww12. In the illustrated example, the write word line signals ww1 are "one-hot"—in other words, only one word line or row is active in any given cycle, and thus only one of the write word line signals ww1 is activated per cycle. For example, if the first row 512a of the array 502 is to be selected, the first write word line signal ww10 goes high.

Thus, the OR gate 514a of the first row 512a outputs a high signal that is received by the AND gate 516a of the first row 512a, the output of which alternates in accordance with the clock pulse CP. The alternating output of the AND gate 516a of the selected first row 512a is inverted by the inverter 518a, such that the clock and clock bar signals CLK, CLK_b are provided to the flip flop standard cells 200 of the first row 506a of the array 502.

In contrast, the remaining write word line signals ww11, ww12 are at a logic low. The OR gates 514 of the non-selected rows 512b, 512c output a logic low signal based on the received logic low write word line signals ww11, ww12, as well as the low scan enable signal SE. Therefore, the outputs of the AND gates 516 of the non-selected rows 512b, 512c are held low, even when the clock pulse CP pulses.

The memory device 500 further includes a column driver 520a, 520b, 520c (collectively column drivers 520) for each of the columns 504a, 504b, 504c of the array 502. Each of the column drivers 520a, 520b, 520c has a first AND gate 522a, 522b, 522c (collectively first AND gates 522), and second AND gates 524a, 524b, 524c (collectively second AND gates 524) that respectively output the hold HOLD and bit write BITWR signals for their corresponding column 504a, 504b, 504c. The output signals of the first and second AND gates 522, 524 are also received by respective first inverters 526a, 526b, 526c (collectively first inverters 526) and second inverters 528a, 528b, 528c (collectively second inverters 528) to generate the hold bar HOLD_b and bit write bar BITWR_b signals. The first and second AND gates 522, 524 each receive the scan enable bar signal SE_b (inverted scan enable signal SE). The first and second AND gates 522, 524 each receive a corresponding column select, or bit enable signal BIT_EN which functions to select the desired column for read/write operations. The first AND gates 522 each receive an inverted bit enable signal BIT_EN, while the second AND gates 524 each receive the bit enable signal BIT_EN. Since the inputs to the first AND gates 522 are both inverted, the first AND gates function as negative AND gates.

When the scan mode is selected, the scan enable signal SE goes high. Each of the first and second AND gates 522, 524 invert the received scan enable signal SE, such that the first AND gates 522 effectively receive the scan enable bar signal SE_b. The high scan enable signal SE (low scan enable bar signal SE_b) received by the AND gates 522, 524 results in all of their outputs being low. Accordingly, the bit write BITWR and hold signals HOLD are all low (BITWR_b and HOLD_b are high), resulting in neither the data received at the data input terminal 408 being written to the flip flop standard cell 200 nor the output signal Q at the output terminal 466 being fed back to the flip flop standard cell 200. Instead, the scan data input receive at the scan input terminal 404 is input to the flip flop standard cells 200 of the array 502.

In the normal operation mode (not the scan mode), the scan enable signal SE is low. This allows generating the appropriate hold and bit write signals for the selected columns 504 of the array 502. For example, if a data value is to be written to the first column 504a, the corresponding bit enable signal BIT_EN0 goes high. Thus, the first AND gate 522a receives the inverted low scan enable signal SE and the inverted high bit enable signal BIT_EN0, resulting in a low output from the first AND gate 522a. The low output of the first AND gate 522a translates to a low hold signal HOLD0 for the first column 504a, such that the current output signal Q is not fed back from the data output terminal 466 and held by the selected flip flop standard cell 200. The first AND gates 522b, 522c of the non-selected columns 504b, 504c each receive inverted low bit enable signals BIT_EN1, BIT_EN2, resulting in the first AND gates 522b, 522c each providing a high hold signal HOLD1, HOLD2. Thus, the flip flop standard cells 200 of the non-selected columns 504b, 504c each hold their current data values rather than writing a received data input signal.

The second AND gate 524a of the selected column 504a also receives and inverts the low scan enable signal SE. The second AND gate 524a further receives the high bit enable signal BIT_EN0, and therefore outputs a high bit write signal BITWR0. The high bit write signal BITWR0 received at the bit write terminal 416 (and low bit write bar BITWR_b signal received at terminal 410) allow a data input signal D received at the data input terminal 408 to be latched by the flip flop standard cell 200 of the selected columns 504a.

As shown in the example of FIG. 5, data input signals D0, D1, D2 (collectively data signals D) are coupled to the input terminals 408 of the flip flop standard cells 200 of the respective columns 504a, 504b, 504c. The data signals D0, D1, D2 may be coupled to the appropriate flip flop standard cells 200 via a buffer circuit 530 that includes, for example, two series-connected inverters. Thus, data signal D0 for the selected first column 504a would be latched by the flip flop standard cell 200 based on the low hold signal HOLD0 and the high bit write signal BITWR0.

Figure 6:
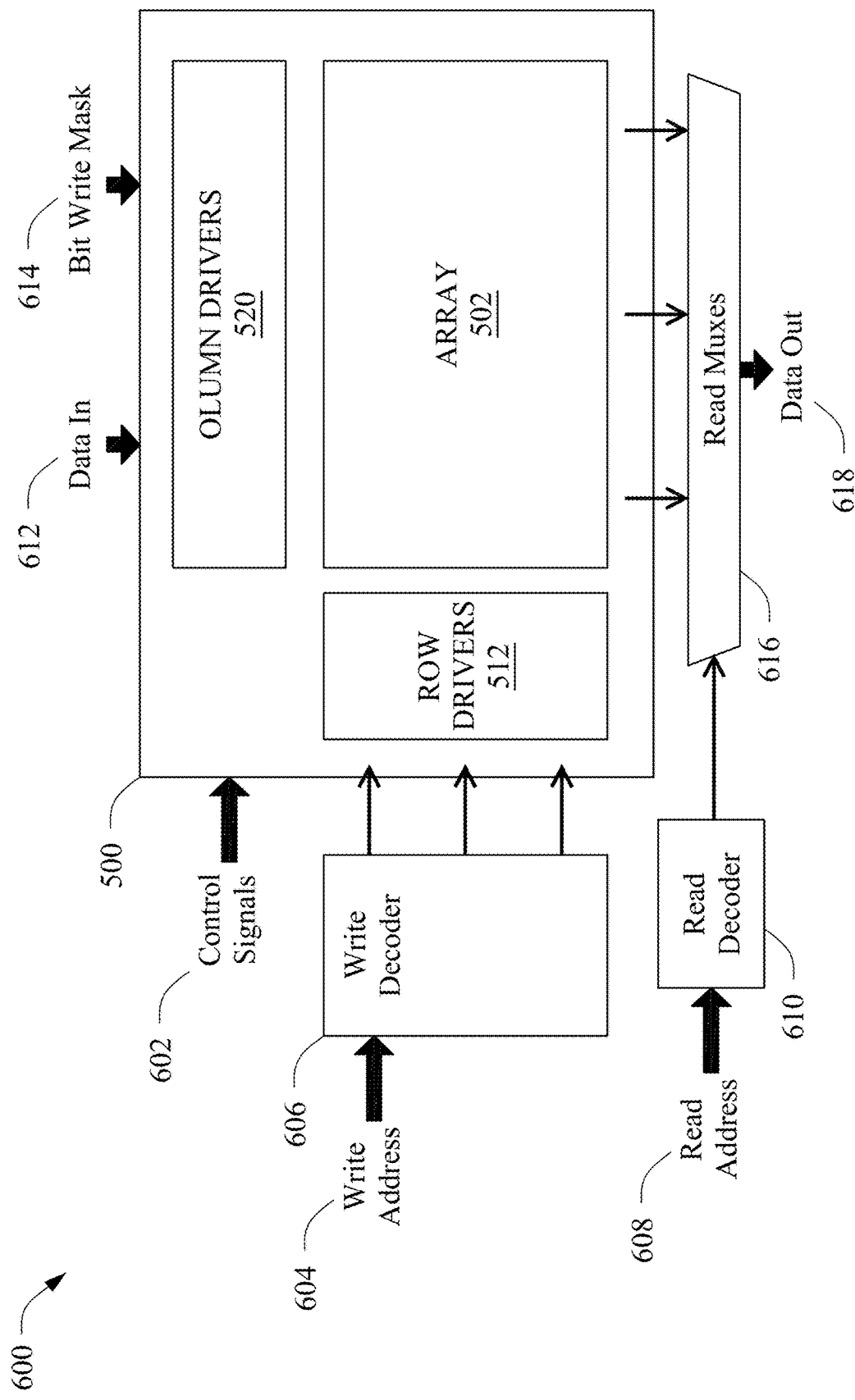
FIG. 6 is a block diagram illustrating further aspects of the memory device of FIG. 5 in accordance with some embodiments.

FIG. 6 is a block diagram illustrating further components that may be associated with the memory device 500 of FIG. 5. In the illustrated example, a write decoder 606 configured to decode the supplied write address 604 may provide output signals to the rows drivers 512 of the array 502. The write decoder 606 may supply the array 500 with the write word line signals ww10, ww11, ww12 discussed in conjunction with FIG. 5. Control signals 602 as well as the data in 612 and the bit write mask 614 may further be provided into the array. A read decoder 610 is configured to decode a supplied read address 608 and may send the decoded address to a read multiplexers 616 that combines the signals output from the array to provide a data output 618.

Figure 7:
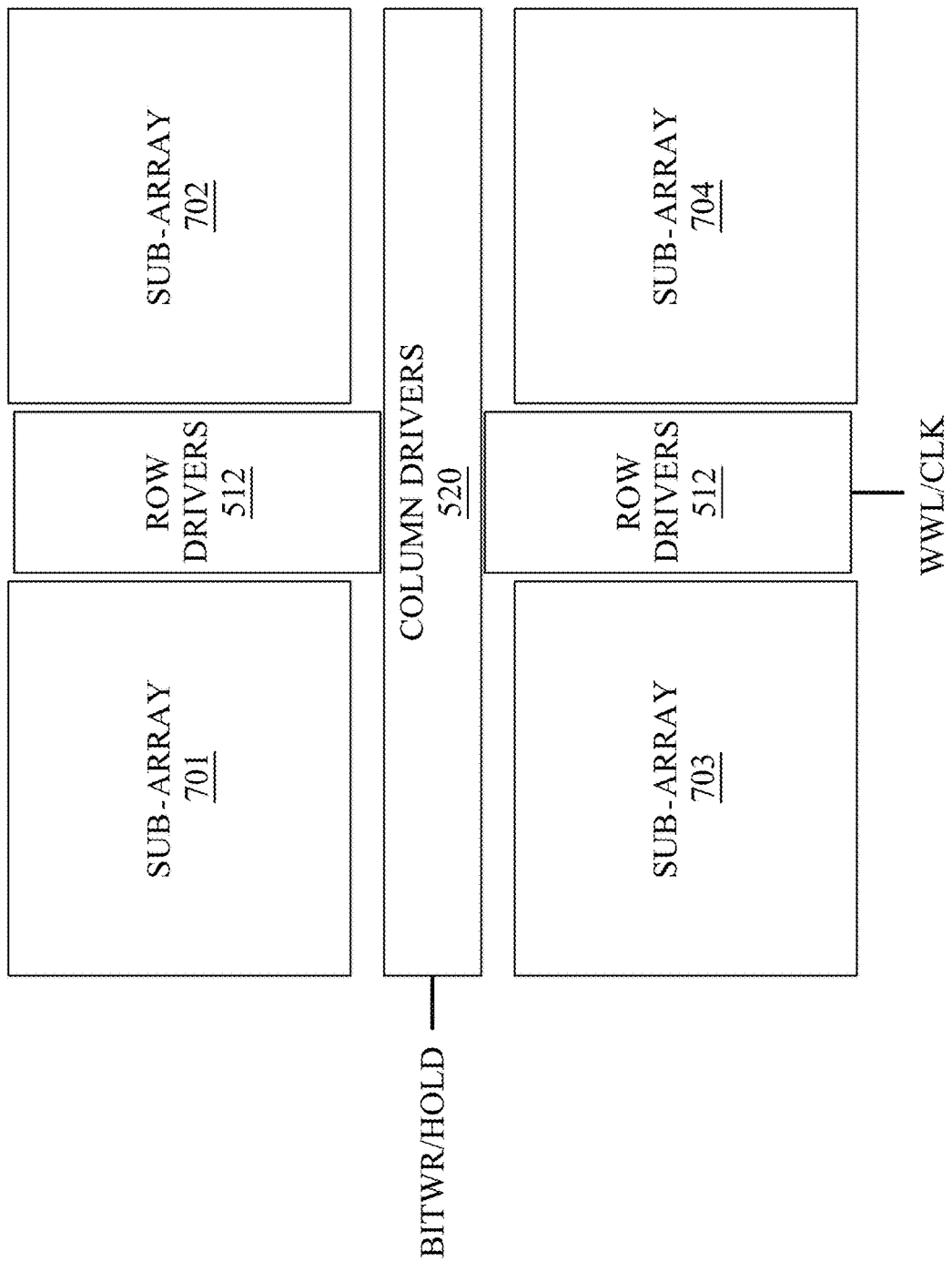
FIG. 7 is a block diagram illustrating an example of a memory device with an array of flip flop standard cells divided into sub-arrays in accordance with some embodiments.

FIG. 7 depicts an example implementation of an array 700 of flip flop standard cells 200 in which the memory array 700 is segmented into four sub-arrays 701, 702, 703, 704. As noted above, the flip flop standard cells 200 are configured for use in memory arrays such as the sub-arrays 701-704 and as such, certain signals and circuitry is provided at the array level rather than incorporated into the flip flop standard cell 200. In an arrangement such as the array 700 shown in FIG. 7, the array-level functionality may be positioned between the sub-arrays 701-704.

Thus, the row drivers 512 that receive signals such as the write word line and clock pulse signals and generate the clock signals shown in FIG. 5 are positioned centrally with the sub-arrays 701 and 703 on one lateral side of the row drivers 512, and the sub-arrays 702 and 704 on the other lateral side of the row drivers 512.

Similarly, the column drivers 520 that receive the bit enable signals and generate the bit write and hold signals as shown in FIG. 5 are positioned centrally with the sub-arrays 702 and 702 above the column drivers 520 and the sub-arrays 703 and 704 below the column drivers 520. This "butterfly" floor plan minimizes routing distance for the signals generated at the array level, thus improving speed and also reducing power consumption.

Figure 8:
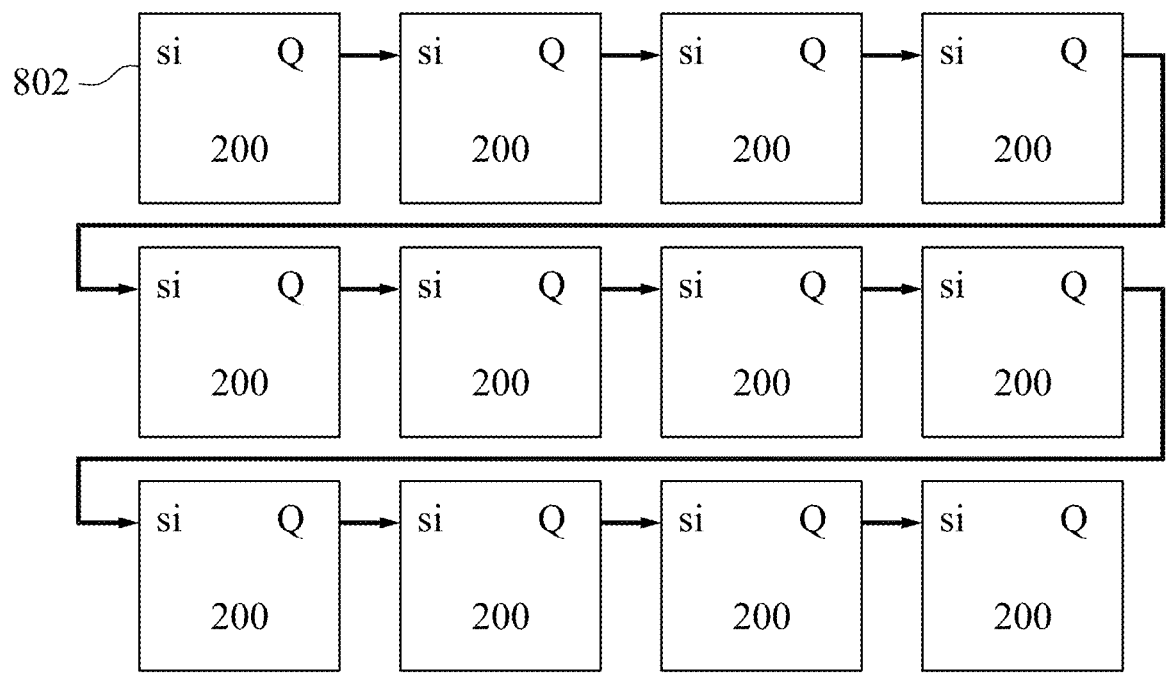
FIG. 8 is a block diagram illustrating an example of a scan testing arrangement for the disclosed flip flop standard cells in accordance with some embodiments.

FIG. 8 is a block diagram depicting full scan functionality 800 of the disclosed flip flop standard cells 200. FIG. 8 illustrates how the flip flop standard cells 200 may be connected with the data output terminal Q of one flip flop standard cell 200 connected to the scan data input SI of the next flip flop standard cell 200. This allows for an entire array of the flip flop standard cells 200 to employ a scan-based testing methodology such as Automatic Test Pattern Generation (ATPG). Further, the scan arrangement shown in FIG. 8 may eliminate the need for more costly testing arrangements such as Built-In Self-Test (BIST), which requires additional outside logic incorporated into the memory array. Chaining the flip flop standard cells 200 together as shown in FIG. 8 may allow for testing access to the entirety of the array of flip flop standard cells 200.

Figure 9:
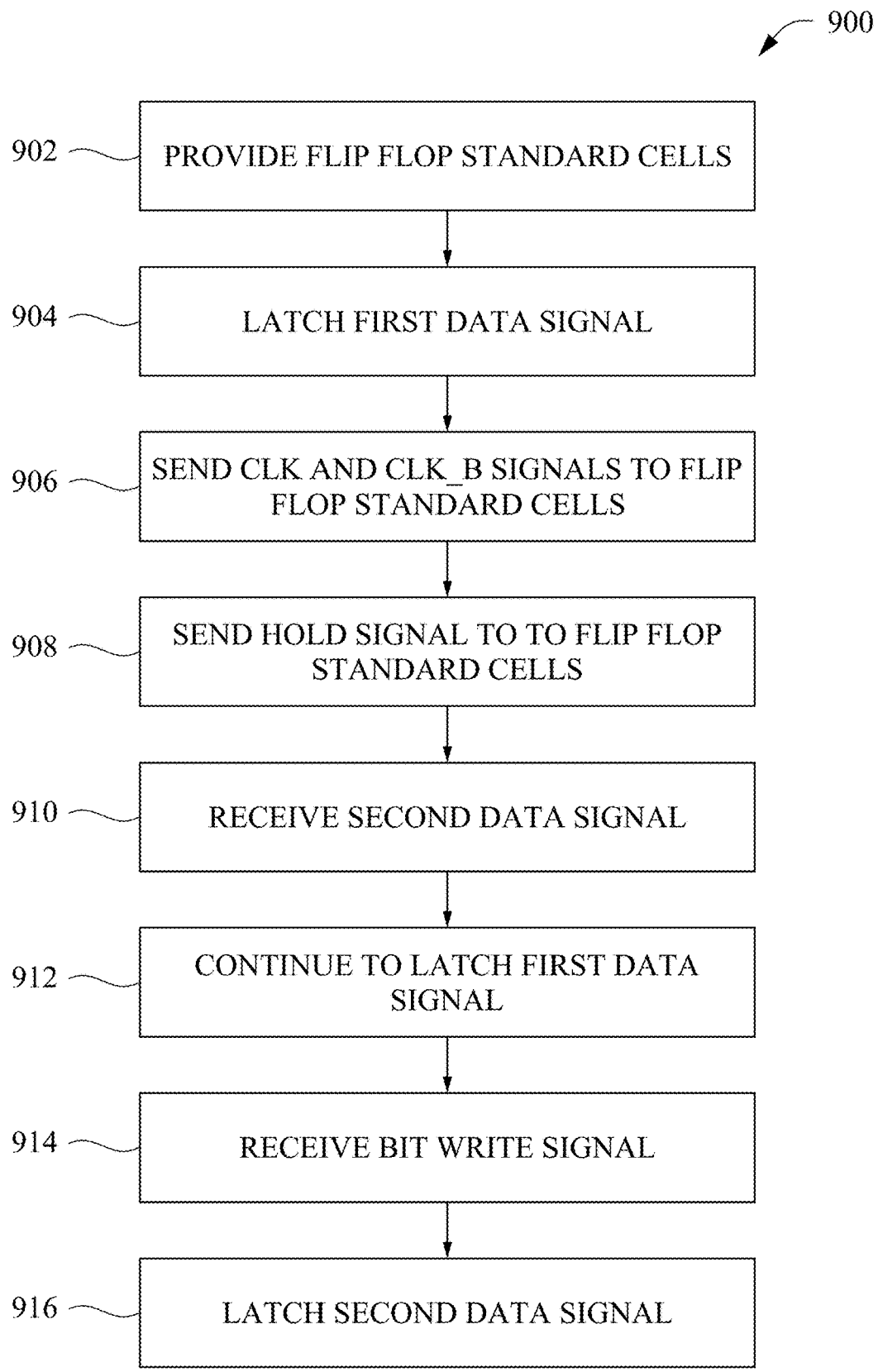
FIG. 9 is a flow diagram illustrating an example of a method for operating a memory device in accordance with some embodiments.

FIG. 9 generally illustrates an example of a method 900 for operating a memory device, such as the memory device illustrated in FIG. 5 discussed above. The process starts at an operation 902 where a plurality of flip flop standard cells are provided. In some examples, the flip flop standard cells 200 shown in FIG. 4 may be provided in operation 902. As noted above, each of the flip flop standard cells 200 may include a data input terminal, a hold terminal, and a clock terminal, for example. At an operation 904, a first data signal is latched into each of the plurality of flip flop standard cells. Referring again to FIG. 4, the first data signal may be a data signal D received at the input terminal 408 and latched by the master and slave latches 310, 312 for output at the output terminal 466.

At an operation 906, a clock signal and an inverted clock signal are provided to the clock input terminal of each of the plurality of flip flop standard cells. As noted above, since the flip flop standard cells 200 are configured for a memory array, an external clock buffer provides the clock signal CLK as well as the inverted clock bar signal CLK_bar to each of a plurality of the flip flop standard cells 200. In contrast, typical flip flop cells would receive a clock pulse and then generate the clock and clock bar signals using a buffer integrated with the flip flop cell.

At an operation 908, a hold signal is sent to the hold terminal of each of the plurality of flip flop standard cells 200. As noted above, when the hold signal HOLD is asserted, the current data signal is held by the flip flop standard cell 200 rather than writing a received data signal to the flip flop standard cell 200. Accordingly, in an operation 910, a second data signal is received at the data input terminal of each of the flip flop standard cells, but based on the received hold signal in operation 908, the first data signal is held or continued to be latched into each of the plurality of flip flop standard cells in operation 912, rather than latching the received second data signal.

At an operation 914, a bit write signal is sent to the bit write terminal of each of the plurality of flip flop standard cells. As discussed above, when the bit write signal is asserted, a data signal D received at the input terminal is written or latched by the flip flop standard cells 200. Thus, at operation 916, the received second data signal is latched into each of the plurality of flip flop standard cells in response to the bit write signal.

Aspects of the present disclosure may provide a flip flop standard cell that reduces the number of required transistors, which may result in lower power consumption as well as a smaller cell area. The smaller area allows for more densely packed memory arrays, in turn reducing the routing distance for the critical flip flop signals thus increasing the speed of the device. Additionally, the clocking power is reduced since aspects of the clocking of the array are designed into the floorplan of the flip flop standard cell.

Some enclosed embodiments may provide a flip flop standard cell that includes a data input terminal configured to receive a data signal, clock input terminal configured to receive a clock signal, a data output terminal, and a latch. Additionally, a bit write circuit is configured to receive a bit write signal. The received data signal is latched and provided at the output terminal in response to the bit write signal and the clock signal. A hold circuit is configured to receive a hold signal, and the received data signal is not latched and provided at the data output terminal in response to the hold signal and the clock signal.

In accordance with further aspects of the disclosure, a memory device includes a plurality of flip flop standard cells. Each of the flip flop standard cells has a data input terminal, a clock input terminal, a bit write terminal, and a data output terminal. A first driver circuit is configured to output a clock signal and an inverted clock signal to the clock input terminal of each of the plurality of flip flop standard cells. A second driver circuit is configured to output a bit write signal to the bit write terminal of each of the plurality of flip flop standard cells. Each of the plurality of flip flop standard cells is configured to latch a first data signal received at the data input terminal in response to the received clock and bit write signals.

In accordance with other aspects of the disclosure, a method includes providing a plurality of flip flop standard cells, each of which has a data input terminal, a hold terminal, and a clock terminal. A first data signal is latched into each of the plurality of flip flop standard cells. A clock signal and an inverted clock signal are sent to the clock input terminal of each of the plurality of flip flop standard cells. A hold signal is sent to the hold terminal of each of the plurality of flip flop standard cells. A second data signal is received at the data input terminal of each of the flip flop standard cells, and in response to the hold signal, the first data signal is held or latched into each of the plurality of flip flop standard cells, rather than the received second data signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip flop standard cell, comprising:
   a data input terminal;
   clock input terminal configured to receive a clock signal;
   a data output terminal;
   a latch;
   a bit write circuit configured to receive a bit write signal, wherein a second data signal received on the data input terminal is latched and provided at the output terminal in response to the bit write signal and the clock signal; and
   a hold circuit configured to receive a hold signal, wherein a first data signal received on the data input terminal prior to the second data signal is provided at the output terminal, and the second data signal received on the data input terminal is not latched and provided at the data output terminal in response to the hold signal and the clock signal.

2. The flip flop standard cell of claim 1, further comprising a clock bar terminal configured to receive an inverted clock signal generated external to the flip flop standard cell.

3. The flip flop standard cell of claim 1, wherein the latch includes a master latch and a slave latch.

4. The flip flop standard cell of claim 1, further comprising:
a scan input terminal configured to receive a scan data signal;
a scan enable terminal configured to receive a scan enable signal, wherein the first and second data signals received on the data input terminal are not provided at the data output terminal, and the scan data signal is provided at the output terminal in response to the scan input signal and the clock signal.

5. The flip flop standard cell of claim 4, further comprising a scan enable bar terminal configured to receive an inverted scan enable signal generated external to the flip flop standard cell.

6. The flip flop standard cell of claim 5, further comprising a scan enable transistor having a gate terminal, an input terminal, and an output terminal, wherein the gate terminal is connected to the scan enable terminal, the input terminal is connected to the scan input terminal, and the output terminal is connected to the latch, such that the scan data signal received at the scan input terminal is output to the latch in response to the scan enable signal received at the scan enable terminal.

7. The flip flop standard cell of claim 1, wherein the bit write circuit includes a bit write transistor having a gate terminal, an input terminal, and an output terminal, wherein the gate terminal is connected to the bit write terminal, the input terminal is connected to the data input terminal, and the output terminal is connected to the latch, such that the data signal received at the data input terminal is output to the latch in response to the write signal received at the bit write terminal.

8. The flip flop standard cell of claim 1, wherein the hold circuit includes a hold transistor having a gate terminal, an input terminal, and an output terminal, wherein the gate terminal is connected to the hold terminal, the input terminal is connected to the data output terminal, and the output terminal is connected to the latch, such that an output data signal at the data output terminal is fed back to the latch in response to the hold signal received at the hold terminal.

9. A memory device, comprising:
a plurality of flip flop standard cells, each including a data input terminal, a clock input terminal, a bit write terminal, and a data output terminal;
a first driver circuit configured to output a clock signal and an inverted clock signal to the clock input terminal of each of the plurality of flip flop standard cells;
a second driver circuit configured to output a bit write signal to the bit write terminal of each of the plurality of flip flop standard cells; and
wherein each of the plurality of flip flop standard cells is configured to latch a first data signal received at the data input terminal in response to the received clock and bit write signals.

10. The memory device of claim 9, wherein:
each of the plurality of standard flip flop cells further comprises a hold terminal;
the second driver circuit is configured to output a hold signal to the hold terminal of each of the plurality of flip flop standard cells;
each of the plurality of flip flop standard cells is configured to continue to latch the first data and not latch a second data signal received at the data input terminal in response to the received clock and hold signals.

11. The memory device of claim 9, wherein the plurality of flip flop standard cells are arranged in an array including at least one word line, and wherein the first driver circuit is further configured to output the clock signal and the inverted clock signal to the clock input terminal of each of the plurality of flip flop standard cells in response to a word line select signal.

12. The memory device of claim 9, wherein the plurality of flip flop standard cells are arranged in an array including a plurality of word lines, and wherein the first driver circuit is configured to output the bit write signal in response to a column select signal.

13. The memory device of claim 9, wherein the plurality of flip flop standard cells each include a scan input terminal configured to receive a scan data signal, a scan enable terminal configured to receive a scan enable signal, and scan enable bar terminal configured to receive an inverted scan enable signal, and wherein the memory device further comprises:
an inverter configured to receive the scan enable signal and output the inverted scan enable signal to the scan enable bar terminal of each of the plurality of flip flop standard cells.

14. The memory device of claim 13, wherein the plurality of flip flop standard cells are each configured to provide the received scan data signal to the data output terminal in response to the scan enable signal and inverted scan enable signal.

15. The memory device of claim 9, wherein the plurality of flip flop standard cells are arranged in an array including a plurality of word lines, and wherein the first driver circuit is further configured to pulse the clock signal and the inverted clock signal in response to a received clock pulse to only a first word line of the plurality of word lines in response to a word line select signal.

16. A method, comprising:
providing a plurality of flip flop standard cells, each including a data input terminal, a hold terminal, a clock terminal, and a data output terminal;
latching a first data signal into each of the plurality of flip flop standard cells;
providing the first data signal at the data output terminals of the plurality of flip flop cells;
sending a clock signal and an inverted clock signal to the clock input terminal of each of the plurality of flip flop standard cells;
sending a hold signal to the hold terminal of each of the plurality of flip flop standard cells;
receiving a second data signal at the data input terminal of each of the flip flop standard cells;
continuing to latch the first data signal into each of the plurality of flip flop standard cells in response to the hold signal; and
continuing to provide the first data signal at the data output terminals of the plurality of flip flop standard cells in response to the hold signal.

17. The method of claim 16, wherein the plurality of flip flop standard cells each include a bit write terminal, the method further comprising:
sending a bit write signal to the bit write terminal of each of the plurality of flip flop standard cells;
latching the second data signal into each of the plurality of flip flop standard cells in response to the bit write signal; and
providing the second data signal at the data output terminals of the plurality of flip flop standard cells in response to the bit write signal.

18. The method of claim 16, further comprising:
sending a scan enable signal to each of the plurality of flip flop standard cells; and conducting a scan test of the plurality of flip flop standard cells in response to the scan enable signal.

19. The method of claim 18, further comprising:
inverting the scan enable signal; and
sending the inverted scan enable signal to each of the plurality of flip flop standard cells.

20. The method of claim 18, wherein each of the plurality of flip flop standard cells includes a scan input terminal and a data output terminal, and wherein conducting the scan test includes:
sending a scan data signal to the scan input terminal of a first one of the plurality of flip flop standard cells;
providing an output signal at the data output terminal of the first one of the plurality of flip flop standard cells in response to the scan data signal; and
connecting the data output terminal of the first one of the plurality of flip flop standard cells to the scan input terminal of a second one of the plurality of flip flop standard cells.

\* \* \* \* \*